United States Patent
Suzuki et al.

(10) Patent No.: US 6,441,886 B2
(45) Date of Patent: *Aug. 27, 2002

(54) ILLUMINATION OPTICAL SYSTEM AND EXPOSURE APPARATUS HAVING THE SAME

(75) Inventors: Akiyoshi Suzuki, Tokyo; Yoshiyuki Sekine, Utsunomiya, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/414,437

(22) Filed: Oct. 7, 1999

(30) Foreign Application Priority Data

Oct. 8, 1998 (JP) .......................................... 10-301682

(51) Int. Cl.⁷ ..................... G03B 27/72; G03B 27/42; G03B 27/54
(52) U.S. Cl. ........................ 355/71; 355/53; 355/67
(58) Field of Search ............................ 355/71, 73, 53, 355/67; 356/400; 378/34; 250/492.2, 492.22, 458; 359/708, 618, 629

(56) References Cited

U.S. PATENT DOCUMENTS

| | | | | |
|---|---|---|---|---|
| 4,011,011 A | * | 3/1977 | Hemstreet et al. ............. | 355/18 |
| 4,572,659 A | * | 2/1986 | Omata .......................... | 355/67 |
| 4,682,885 A | * | 7/1987 | Torigoe ........................ | 355/67 |
| 4,822,975 A | * | 4/1989 | Torigoe ..................... | 219/121.85 |
| 4,871,257 A | | 10/1989 | Suzuki et al. ............... | 356/400 |
| 5,160,962 A | | 11/1992 | Miura et al. .................. | 355/53 |
| 5,218,660 A | * | 6/1993 | Omata .......................... | 385/116 |
| 5,636,003 A | * | 6/1997 | Tanitsu et al. ................. | 355/67 |
| 5,677,939 A | * | 10/1997 | Oshino .......................... | 378/34 |
| 5,892,573 A | * | 4/1999 | Takahashi et al. ............. | 355/69 |
| 5,995,303 A | * | 11/1999 | Honguh et al. ............. | 359/708 |
| 6,144,495 A | * | 11/2000 | Koch et al. ................. | 359/618 |

OTHER PUBLICATIONS

Hiroshi Kubota, "Optics", Chapter 1, pp. 39–40.
Yoshisada Hayamizu, "Optics I of Optical Instrument", equation (43.33), pp. 292–297, 1988.

* cited by examiner

Primary Examiner—Russell Adams
Assistant Examiner—Hung Henry Nguyen
(74) Attorney, Agent, or Firm—Fitzpatrick, Cella, Harper, & Scinto

(57) ABSTRACT

An illumination optical system for use in an exposure apparatus for projecting a pattern of a mask onto a substrate. The illumination system includes a first beam shape changing optical system for transforming a light, supplied from a light source, into a slit-like light of an oblong shape, and a second beam shape changing optical system for transforming the slit-like light of oblong shape into a slit-like light of an arcuate shape, the second beam shape changing optical system having a prism element. The mask is illuminated with the slit-like light of arcuate shape.

12 Claims, 7 Drawing Sheets

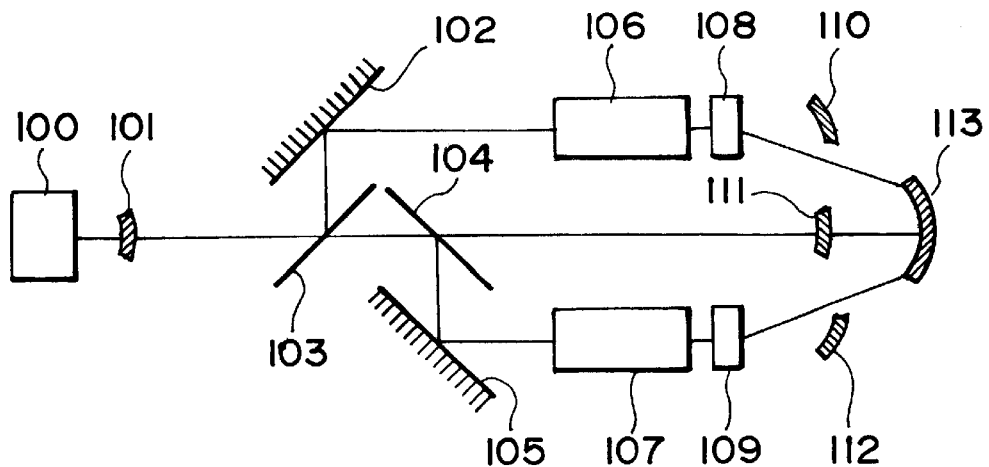
F I G. 6
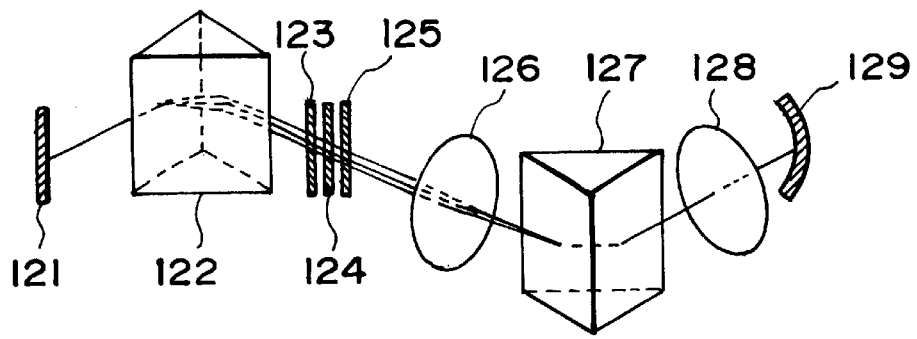
F I G. 7
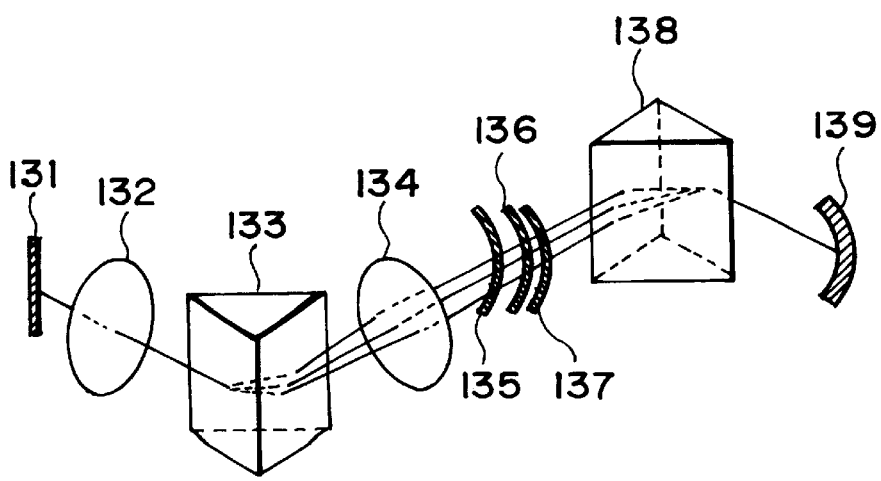
F I G. 8

ILLUMINATION OPTICAL SYSTEM AND EXPOSURE APPARATUS HAVING THE SAME

FIELD OF THE INVENTION AND RELATED ART

This invention relates to an illumination optical system and an exposure apparatus having the same. The present invention is suitably usable in the manufacture of various devices such as a semiconductor device (e.g., IC or LSI), an image pickup device (e.g., CCD), a display device (e.g., liquid crystal panel) or a magnetic head, for example. More specifically, it is suitably applicable in a step-and-repeat type or step-and-scan type exposure apparatus, used in a lithographic process, for illuminating a pattern of a first object such as a reticle with slit-like light of an arcuate shape and for projecting it onto a second object such as a wafer through a projection optical system.

The density of integration of a semiconductor device such as an IC or LSI has been increased more and more and, as a projection exposure apparatus which plays a major role in semiconductor wafer microprocessing, there have been proposed a unit-magnification projection exposure apparatus (mirror projection aligner) wherein a mask and a photosensitive substrate are exposed while being scanned relative to a unit-magnification mirror optical system having an arcuate-shape exposure region, and a reduction projection exposure apparatus (called a stepper) wherein a pattern image of a mask is formed on a photosensitive substrate through a dioptric optical system and the photosensitive substrate is exposed thereby in a step-and-repeat method.

The size of a chip pattern of a single semiconductor device is increasing, and thus enlargement of the picture size has been required for a projection optical system so that a large-area pattern can be printed on a photosensitive substrate.

In consideration of these requirements, many proposals have recently been made on a scanning projection exposure apparatus of a step-and-scan type by which a high resolution and a wide picture size are attainable.

In such scan type exposure apparatuses, a pattern on a reticle surface is illuminated with slit like light. The pattern thus illuminated with the slit-like light is transferred to a wafer through a projection system (projection optical system) and in accordance with a scan motion.

In one scan type exposure apparatus, the scan exposure is made by use of slit-like light of an arcuate shape. In this type, there is a projection optical system intervening between a first object, having a pattern to be transferred, and a second object to which the pattern is to be transferred. The exposure process is performed by use of only a particular abaxial image point. The projection optical system has an optical axis, and its optical characteristic is revolutionally symmetrical with respect to the optical axis. Thus, in the exposure method based on an abaxial image point, slit-like light of an arcuate shape is used.

Generally, collecting the light to an arcuate region is very difficult. In the past, a light source having a light emitting surface of an arcuate shape was developed. In another proposal, as shown in FIG. 5, an arcuate area is extracted out of a region 51, being illuminated in an oblong shape, by use of an aperture member 50 having an arcuate opening. However, development of a light source having an arcuate-shape light emitting surface in the former case is difficult to accomplish if the light is in a short wavelength region such as the DUV (Deep Ultraviolet) region. The arcuate shape extraction in the latter case involves a disadvantage of a very low light utilization efficiency.

SUMMARY OF THE INVENTION

It is an object of the present invention to provide an illumination optical system by which slit-like light of an arcuate shape can be provided easily and with a good light utilization efficiency.

It is another object of the present invention to provide an illumination optical system by which arcuate-shaped illumination can be performed with a good light utilization efficiency by use of an ordinary discharge tube such as an ultra-high pressure Hg lamp or a laser light source (and without use of a special light source), while satisfying a predetermined illumination condition.

It is a further object of the present invention to provide an exposure apparatus of a proximity type, of a step-and-repeat type or of a step-and-scan type, having such an illumination optical system, which can be suitably used in the manufacture of semiconductor devices, for example.

In accordance with an aspect of the present invention, there is provided an illumination optical system, comprising: a first beam shape changing optical system for transforming a light, supplied from a light source, into a slit-like light of an oblong shape; and a second beam shape changing optical system for transforming the slit-like light of an oblong shape into a slit-like light of an arcuate shape, said second beam shape changing means having a prism element; wherein said illumination optical system can be used to illuminate a surface, to be illuminated, with the use of the slit-like light of arcuate shape.

In accordance with another aspect of the present invention, there is provided an exposure apparatus, comprising: an illumination optical system as recited above, for illuminating a mask having a pattern formed thereon; and a projection optical system for projecting the pattern of the mask onto a wafer.

In accordance with a further aspect of the present invention, there is provided a device manufacturing method, comprising the steps of: applying a resist to a wafer; exposing the wafer having the resist applied thereto, with a pattern of a mask by use of an exposure apparatus as recited above; and developing the wafer having the pattern transferred thereto.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6 is a schematic view of a main portion of an arch transforming optical system in an arcuate illumination optical system according to a second embodiment of the present invention.

FIG. 7 is a schematic view of a main portion of an arch transforming optical system in an arcuate illumination optical system according to a third embodiment of the present invention.

FIG. 8 is a schematic view of a main portion of an arch transforming optical system in an arcuate illumination optical system according to a fourth embodiment of the present invention.

DESCRIPTION OF THE PREFERRED EMBODIMENTS

Figure 1:
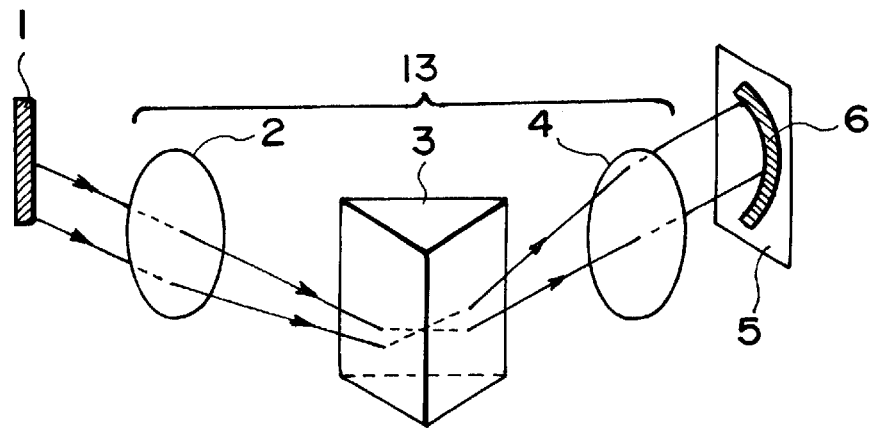
FIG. 1 is a schematic view for explaining an optical principle in an arch transforming optical system according to the present invention.

FIG. 1 is a schematic view for explaining an optical principle in an arch transforming optical system, according to the present invention, for producing slit-like light of an arcuate shape from a slit-like light of an oblong shape. Denoted in the drawing at 13 is the arch transforming optical system.

Denoted at 1 is slit-like light having a sectional shape of an oblong shape. Denoted at 2 is a condensing lens, and denoted at 3 is a prism element (prism). The lengthwise direction of the oblong slit light is parallel to the ridge line of the prism 3. The light emitted from the prism 3 passes the condenser lens 4, and it is imaged upon an image plane 5. Here, the slit-like light 1 of oblong shape passes the prism 3 obliquely. As a result of it, distortion is produced in the shape of light as imaged upon the image plane 5. In this manner, the slit-like light 1 of oblong shape is transformed into slit-like light 6 of arcuate shape.

The optical principle in this mechanism is discussed in "Optics" by Hiroshi Kubota, Chapter 1, with respect to an optical system of a spectroscope.

Conventionally, in a spectroscope, light being restricted to slit-like light of an oblong shape is caused to pass through a prism, for spectroscoping, by which it is transformed into an arcuate shape. The change in shape to be done with this optical system uses refraction and, therefore, the efficiency is very high.

Conventionally, efficient illumination with the use of slit-like light of an arcuate shape is difficult to accomplish. This is because transformation of the shape of light from a light source is difficult to achieve.

Exposure apparatuses for the manufacture of semiconductor devices or liquid crystal devices use a light source of a short arc lamp such as an ultra-high pressure Hg lamp or a xenon lamp, or a laser such as an excimer laser, for example. Considering the light distribution characteristic of a short arc type lamp or the characteristic of light from a laser light source having a good directionality, transforming the shape of light into a shape having a symmetric axis will be easy. Namely, transforming it into a circular shape, an elliptical shape, a square shape or an oblong shape, for example, will be relatively easy.

However, transforming light into an arcuate shape is difficult to achieve. This will be readily understood, when an ordinary lens or a mirror optical system is considered.

In the present invention, the shape of light from a light source is shaped, at first, into an oblong shape, which may be easily produced by transformation, and, after this, it is transformed into an arcuate shape by use of the optical system shown in FIG. 1. With these sequential steps, the light from the light source can be transformed into an arcuate shape with a good efficiency.

Further, the incidence angle of the oblong slit light 1 upon the prism 3 or the focal length of the condenser lens 4, for example, may be modified in various ways, to change the curvature radius of the arch as desired. This expands the applicability to various projection exposure apparatuses.

Figure 2:
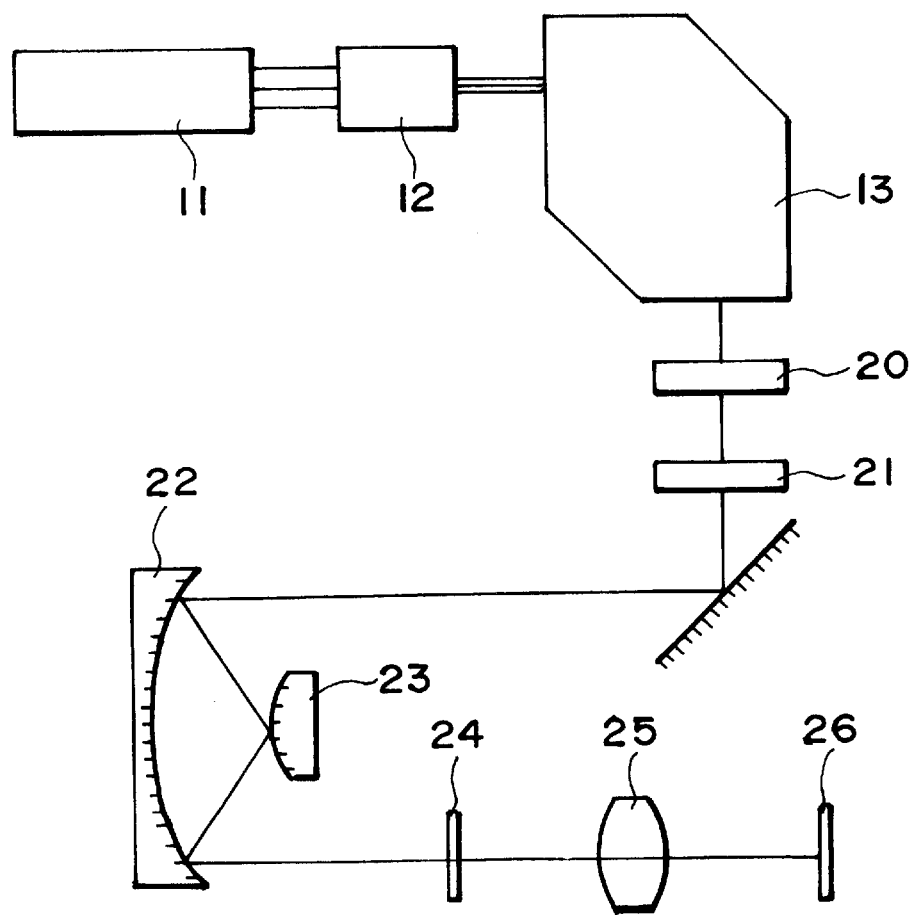
FIG. 2 is a schematic view of a main portion of an exposure apparatus having an arcuate illumination optical system according to a first embodiment of the present invention.

FIG. 2 is a schematic view of a main portion of an exposure apparatus having an arcuate illumination optical system according to a first embodiment of the present invention, wherein an excimer laser is used as a light source. Denoted in the drawing at 11 is an excimer laser light source, and denoted at 12 is a beam shape changing optical system for shaping a light beam into a predetermined oblong beam shape. The beam shape changing optical system may comprise a cylindrical lens, a toric lens, an anamorphic lens or an optical pipe of a slit-like shape, for example, and it serves to transform the shape of output light from the laser 11 into slit-like light of an oblong sectional shape, efficiently.

The light as outputted from the beam shape changing optical system 12 corresponds to the slit light 1 in FIG. 1. Denoted at 13 is an arch transforming optical system having been described with reference to FIG. 1. In this portion, the light from the light source 11 is transformed into light of an arcuate sectional shape. Denoted at 20 is an optical system for correcting an arcuate illumination region as defined by the arch transforming optical system 13 in accordance with the need for practical illumination of a mask or a reticle. Specifically, it comprises a correction optical system which functions so that the arch transforming optical system 13 is kept telecentric and that the illuminance distribution and the light distributing characteristic within the arcuate illumination region are kept substantially uniform, for example.

Denoted at 21 is an arcuate slit which is an aperture member having an arcuate opening, for extracting a predetermined size from the portion being illuminated in an arcuate shape. The width of the arcuate slit 21 in a radial direction is variable, such that the uniformness of illuminance during the scan can be adjusted. An optical system denoted at 22 and 23, that is, a catoptric system, is a relay optical system for imaging the arcuate slit 21. By means of this relay optical system at 22 and 23, the arcuate slit 21 is imaged upon a mark or a reticle (object) 24 having a pattern, formed thereon, to be transferred to a predetermined plane. Thus, the object 24 is illuminated with the light from the arcuate slit 21.

The pattern on the object 24 thus illuminated is image upon a wafer 26 (substrate to be exposed) by means of the projection optical system 25.

Figure 3:
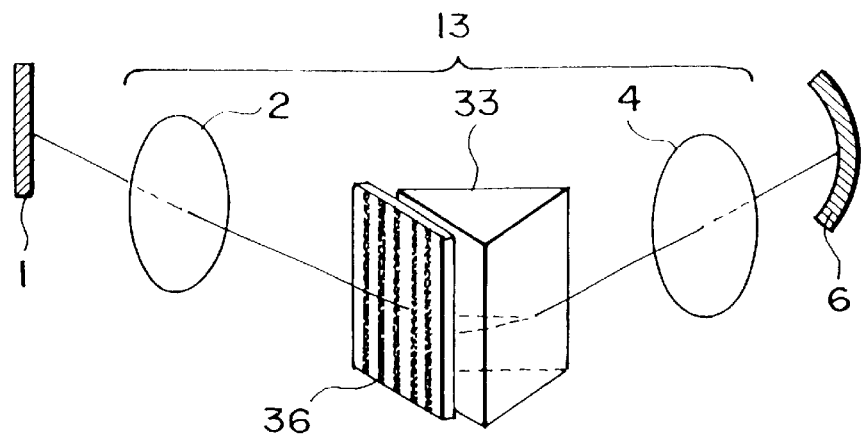
FIG. 3 is a schematic view of a main portion of a modified example of an arch transforming optical system in an arcuate illumination optical system according to the first embodiment of the present invention.

FIG. 3 is a schematic view of a main portion of a modified example of an arch transforming optical system in an arcuate illumination optical system according to the first embodiment of the present invention. In this embodiment, an achromatism action is performed inside an arch transforming optical system 13. Thus, the system can meet exposure light having a broad wavelength bandwidth.

An arch transforming optical system of the present invention may use a prism. There may be a problem that the position of an arch to be imaged may change in dependence upon the wavelength, because of a dispersion function of a material such as a glass that constitutes the prism. In order to cancel this, while taking into account that, in the arch transforming optical system 13 of FIG. 3, a prism 33 and a grating (diffraction grating) 36 have opposite dispersion functions, the grating 36 is disposed before the prism 33 to correct the dispersion. As a result of it, dispersion of the arch transforming optical system 13 as a whole can be made smaller.

For higher light utilization efficiency of the optical system, the grating 36 may preferably be of a blazed type. It is to be noted that the grating may be disposed after the prism (i.e., at the light exit side of the prism), not before the prism (i.e., at the light entrance side of the prism) as in the example of FIG. 3.

When the arch transforming optical system 13 of this embodiment is incorporated into the illumination optical system of FIG. 2, not only a laser but also a short arc type lamp can be used as a light source.

While in FIG. 3 the grating 36 and the prism 33 are illustrated as being separate elements, these elements may be combined into an integral structure.

When a light source which emits light of a broad wavelength bandwidth is used, even with the use of an inverse dispersion function of the grating, it is not easy to completely remove chromatic aberration throughout the whole band. For this reason, there are cases where a small chromatic aberration remains. Such residual chromatic aberration functions to expand the arch in its radius direction.

The illumination optical system shown in the embodiment of FIG. 2 has an arcuate slit 21 and, therefore, the shape of an arch upon the object 24 does not change. On the other hand, if there remains chromatic aberration, the portion being eclipsed by the arcuate slit 21 increases which results in a decrease of efficiency.

In order to avoid this, an increase in the width of an arch due to the residual chromatic aberration may be detected beforehand by calculation, and the length of a side of the oblong shape along its widthwise direction may be shortened beforehand prior to incidence upon the arch transforming optical system. Here, a wavelength distribution may appear in the radius direction of the arch. However, when such a broad wavelength bandwidth light source is used, in many cases, the projection optical system for the mask or reticle transfer is provided by a mirror system. Since there is no chromatic aberration present in such a mirror system, the wavelength distribution in the illumination region does not cause any inconveniences in relation to the pattern transfer.

Further, in an exposure apparatus using arcuate slit light, generally the illumination region is relatively and scanningly shifted along the object surface. The wavelength distribution on the wafer is thus averaged, and it has an effect of reducing the inconvenience.

In this embodiment, luminance distribution adjusting means such as an optical filter, for example, may be used to adjust the luminance distribution of the oblong slit light from the beam shape changing optical system, more particularly, the luminance distribution in the widthwise direction and/or the lengthwise direction of the slit light, for example. On that occasion, the luminance of slit light of an arcuate shape can be made uniform. This applies to all the embodiments to be described later.

Figure 4:
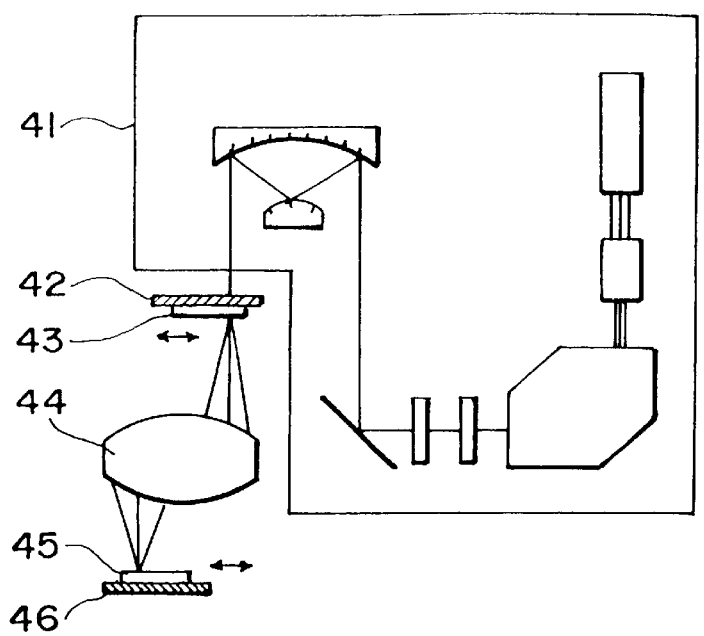
FIG. 4 is a schematic view of a main portion of a scan type exposure apparatus having an arcuate illumination optical system according to the present invention.
Figure 5:
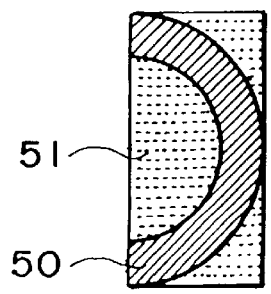
FIG. 5 is a schematic view for explaining the manner of producing arcuate illumination, in accordance with a conventional method.

FIG. 4 is a schematic view of a main portion of a scan type exposure apparatus into which an arcuate illumination optical system according to the present invention is incorporated. Denoted at 41 is an arcuate illumination optical system having a prism element such as described with reference to FIGS. 1 and 3. A grating element for correction of chromatic aberration may be omitted in a case of a laser light source and in dependence upon the characteristic of the light source. In a case of a short arc type light source, a grating element such as shown in FIG. 3 may desirably be used.

Denoted at 42 is a scanning mechanism for scanningly moving an object 43 such as a mask or a reticle to be illuminated by the illumination optical system 41. Denoted at 44 is a projection optical system which may comprise an ordinary imaging system of a dioptric type, catoptric type or catadioptric type, for example. Denoted at 45 is a workpiece such as a wafer to which a pattern is to be transferred. It is placed so that a pattern formed on the object 43, being illuminated, is projected and imaged thereupon by the projection optical system 44. Denoted at 46 is a scanning mechanism for scanningly moving the workpiece 45, and it operates in synchronism with the scanning mechanism 42 for the object 43.

Since the illumination region is restricted into a slit-like shape, scan is necessary for the projection of the whole object 43, and only such a region where aberration is constant with respect to a revolutionally symmetric optical system can be used to this end.

In this embodiment, the object 43 to be illuminated and the object 45 to be exposed are moved in scan directions as depicted by arrows, in synchronism with each other and at a speed ratio corresponding to the projection magnification. By this, the pattern formed on the object 43 can be transferred and printed on the workpiece 45 through scanning projection exposure.

The arcuate illumination optical system of this embodiment uses a prism element to provide an arcuate illumination region (slit light), and it uses distortion of an image to be produced by passage of an oblong-shaped slit light through the prism element.

Generally, in an exposure apparatus of a slit scan method, the slit has a lengthwise direction and a widthwise direction. In this embodiment, the light from a light source is first transformed into a prolonged slit of an oblong shape and, thereafter, it is transformed into slit light of an arcuate shape as the light passes through the prism element.

Here, there may occur the following inconveniences, although some of them have been described hereinbefore.

(A-1) Because of use of a prism and of its dispersion function, a shift due to chromatic aberration may be produced in the light passing therethrough.

(A-2) Even if the luminance distribution within the slit of an oblong shape is uniform, an illuminance distribution may be produced within slit light of an arcuate shape, transformed by the prism element, mainly in a direction of a deviation angle.

(A-3) The curvature radius necessary for the arch is small but, on the other hand, the length necessary for the lengthwise direction of the illumination region is large. This may apply restrictions in the optical arrangement such as enlargement of incidence angle to a prism or a difficulty in design of a condenser lens, for example.

(A-4) When the illumination region is long in its lengthwise direction, there may occur deviation from an arch (change in curvature) which may become larger as closer to the end.

The embodiments of the present invention to be described below can solve at least one of the problems (A-1) to (A-4) above.

The technical significances of the inconveniences described in items (A-1) to (A-4) will now be explained in greater detail.

Figure 11:
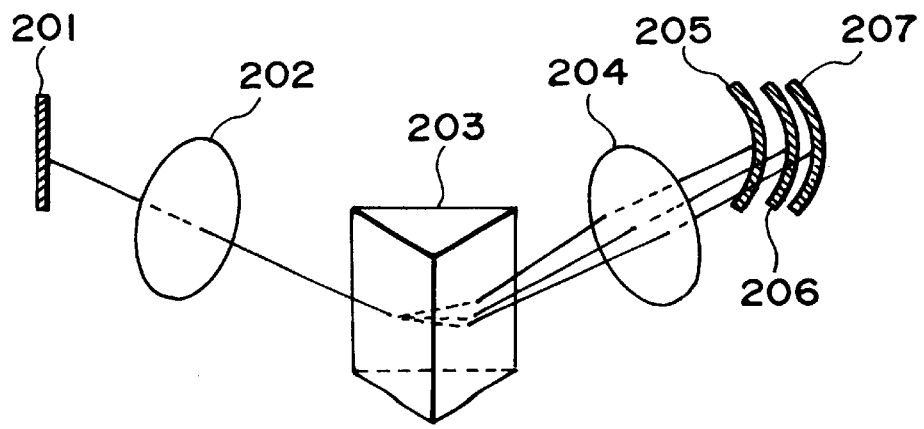
FIG. 11 is a schematic view for explaining the principle of an arch transforming optical system as well as a problem involved therein.

Referring to FIG. 11, item (A-1) will be explained first. In the example of FIG. 11, in a slit 201 of oblong shape, there is light of three wavelengths from a Hg lamp, that is, g-line (wavelength λ=435.8 nm), h-line (λ=404.7 nm) and i-line (λ=365.0 nm). By means of the dispersion through a prism 203, the slit light of arcuate shape is separated into lights 205, 206 and 207 of respective wavelengths. These lights 205, 206 and 207 correspond to the wavelengths of i-line, h-line and g-line, respectively.

The inconvenience at item (A-2) may be caused as follows. As shown in FIG. 11, light from a certain single point within the oblong-shaped slit light enters a prism 203 at a certain angle determined by passage through a condenser lens 202. The light emitted from the prism 203 goes through a condenser lens 204 and it is imaged at a certain point on an arch.

Here, generally, the angular magnification of the prism 203 is dependent upon the incidence angle to the prism. Since the magnification differs with the location within the oblong shape, it is seen that, even if the luminance distribution is uniform over the original oblong shape, the illuminance upon the arch changes. Further, as regards light rays outside the primary section, the apparent refractive index changes and, thus, they have an angular magnification different from that within the primary section. The difference between these two angular magnifications is also a factor for causing an illuminance distribution upon the arch. Therefore, like the problem at item (A-1), this is inevitable in relation to the use of a prism.

As regards item (A-3), reference may be made to "Optics I of Optical Instrument" by Yoshisada Hayamizu, page 297, equation (43.33). In this equation, a curvature radius R of an arch in a case where slit light of an oblong shape is transformed into an arcuate shape is given, that is:

$$R = fn^2 \cot i_1 / [2(n^2 - 1)]$$

where f is the focal length of a lens (corresponding to a condenser lens 204 shown in FIG. 11) disposed after the prism, n is the refractive index of the glass material of the prism, and $i_1$ is the angle of incidence of light upon the prism.

Usually, the refractive index n is about 1.5, and it does not change largely if the glass material is changed. Therefore, what determines the curvature radius R may be considered as being f and $i_1$.

Here, if such a focal length with which the aberration of the condenser lens can be corrected sufficiently is set while taking into account the length of the slit light, as required, in its lengthwise direction, then the focal length f becomes larger. On the other hand, if the curvature radius R as required is small, it is necessary to make coti1 small, that is, to make $i_1$ large.

The inconvenience at item (A-4) may attribute to that: in the explanation in "Optics I of Optical Instrument" for that the slit light of an oblong shape is transformed into slit light of an arcuate shape after passage through the prism, it uses an approximation that the angle v of each light ray with respect to the primary section is small. This approximation corresponds to that the length of the oblong-shaped slit light in its lengthwise direction is sufficiently small. However, the required length of the oblong-shape slit in its lengthwise direction is large beyond this approximation range.

An effective measure for solving these problems may be using at least two arcuate-shaped slit lights and combining them with respect to the direction of a deviation angle to produce slit light of desired arcuate shape. More specifically, without directly transforming one slit light of oblong shape into one slit light of arcuate shape, arches each being smaller than a desired arch are first produced and, based on it, they may be combined with each other. By this, an arch of a desired size can be produced. This is particularly effective to the problems discussed at items (A-2), (A-3) and (A-4).

Another effective measure may be producing a wavelength distribution in the lengthwise direction of the oblong-shaped slit light. This is to apply inverse dispersion to the oblong shape before transformation while taking into account the dispersion of the arch by the prism, to thereby achieve correct formation of the arch. This can be easily accomplished by using the same prism as that for the arch transformation. Thus, the problem at item (A-1) can be solved.

As a further effective measure for the problem at item (A-2), a luminance distribution may be provided in an oblong shaped slit light. Basically, the transformation of slit light through the prism from the oblong shape to the arcuate shape is based on one-to-one imaging. However, due to two kinds of influences, that is, a difference in angular magnification dependent upon the incidence angle at the prism along its primary section, and a difference in apparent refractive index in relation to the incidence with an angle with respect to the primary section, the magnification differs with the location. As a result of it, apparently, the illuminance decreases more being closer to the end portion. However, the uniformness of illuminance distribution on the arch can be held if a luminance distribution is provided within the oblong shape to cancel it. As regards such a luminance distribution to be provided within the oblong shape, in a case where the opening angle of the arch is small, a distribution which changes monotonously only in the widthwise direction may be applied. Generally, however, a distribution increasing from the center toward the edge, also with respect to the lengthwise direction, should be provided.

If all the problems discussed at items (A-1) to (A-4) should be solved at once, the solutions described above may be applied together. Next, an embodiment by which at least one of the problems at items (A-1) to (A-4) can be solved, will be described.

FIG. 6 is a schematic view of a main portion of an arcuate illumination optical system according to a second embodiment of the present invention. Denoted in the drawing at 100 is an arch transforming optical system such as described with reference to FIGS. 1 and 3, or an arch transforming optical system to be described later. It functions to emit slit light of an arcuate shape.

Denoted at 101 is a light beam (slit light) of arcuate shape, as defined by the arch transforming optical system 100 having a prism element. Denoted at 102 is a reflection mirror, and denoted at 103 is a semi-transparent mirror having an intensity transmission factor of ⅔. Denoted at 104 is a semitransparent mirror having an intensity transmission factor of ½. Denoted at 105 is another reflection mirror.

Denoted at 106 and 107 are image rotators, and denoted at 108 and 109 are adjusting optical systems for adjusting the position of an arch. Denoted at 110, 111 and 112 are slit lights of arcuate shape, being formed by this optical system. Denoted at 113 is an illumination region (slit light beam) of arcuate shape as desired, which can be produced by combining the arches of the arcuate slit lights 110, 111 and 112 with respect to the deviation angle direction.

Here, the arcuate shaped slight light 101 is made smaller than the desired arcuate illumination region 113, with respect to the direction of the arch.

In this embodiment, one arcuate slit light 113 is formed on the basis of three (or plural) arcuate slit lights. Thus, the opening angle of the arch of the slit light 101 is one-third of the slit light 113. However, the number of arches to be used to provide the whole arch may be changed as desired.

As the slit light 101 impinges on the semitransparent mirror 103, one-third of the intensity is reflected while the remaining two-thirds is transmitted therethrough. The transmitted slit light with the intensity of two-thirds is then separated into two slit lights of arcuate shape, by the semi-transparent mirror 104 with which the intensity can be divided equally through transmission and reflection. In this manner, the light is divided into three slit lights of arcuate shape having the same intensities. Subsequently, two of the three are rotated by the image rotator 106 or 107. The rotational angle to be applied here corresponds to a half of the opening angle of the original arch.

Thereafter, the thus rotated arcuate shaped slit lights 110 and 112 pass through the optical systems 108 and 109, respectively, by which they are aligned to be combined with the non-rotated arcuate slit light 111 into a single arch. Then, they are imaged to provide a desired slit light 112 of desired arcuate shape.

While the optical arrangement of this embodiment functions to produce a plurality of arcuate slit lights of small opening angle, with this arrangement, the length of the original slit light of oblong shape in the lengthwise direction can be shortened, when a slit light of a desired arcuate shape is to be produced. The problems attributable to this and discussed at items (A-2)–(A-3), can be solved.

In this embodiment, the elements at 102–105 are components of the dividing means, and the elements at 106–109 are components of the arch combining means.

FIG. 7 is a schematic view of a main portion of an arch transforming optical system of an arcuate illumination optical system according to a third embodiment of the present invention. Denoted in the drawing at 121 is slit light of an oblong shape. While not shown in the drawing, the beam shape thereof is formed by means of an optical system similar to the beam shape changing optical system having been described with reference to FIG. 2. Denoted at 122 is a prism element (prism). Denoted 123, 124 and 125 are slit lights of oblong shape, having been dispersed into wavelengths of i-line, h-line and g-line, respectively, by means of the prism element 122. Denoted at 126 is a condenser lens, and denoted at 127 is another prism element (prism). Denoted at 128 is another condenser lens, and denoted at 129 is a slit like illumination region (slit light beam) of arcuate shape.

The prism 127 is a prism element for transforming slit light of oblong shape into slit light of arcuate shape. There is another prism (prism 122) used in the arcuate illumination optical system of this embodiment, for correction of dispersion by the prism 127. The light from the slit light beam 121 of oblong shape is directly incident on the prism 122 without passage through any condenser lens. As a result of it, the light is not formed into an arcuate shape but, rather, it emerges while being kept as slit light of oblong shape.

However, when the slit light beam of oblong shape comprises light having three wavelengths of g-line, h-line and i-line, the light to be emitted from the prism element 122 is dispersed into lights such as at 123, 124 and 125.

Under the state being so dispersed, the light goes through the condenser lens 126 and enters the arch transformation prism element 127. The light emitted therefrom is collected by a condenser lens 128, by which slit light 129 of arcuate shape, free from color dispersion, can be provided. In the manner described above, the prism 122 is used to provide light having been deflected in an opposite direction as the deflection direction of the prism 127, and then the light is projected upon the arch transformation prism 127. As a result of it, the dispersion produced by the prism 127 is corrected.

FIG. 8 is a schematic view of a main portion of an arch transforming optical system of an arcuate illumination optical system according to a fourth embodiment of the present invention. Denoted in the drawing at 131 is slit light of oblong shape. Like the embodiment of FIG. 7, the beam shape thereof is formed by means of a beam shape changing optical system (not shown). Denoted at 132 is a condenser lens, and denoted at 133 is a prism element for transforming slit light of oblong shape into slit light of arcuate shape. Denoted at 134 is another condenser lens. Denoted 135, 136 and 137 are slit lights of arcuate shape, having been dispersed into wavelengths of i-line, h-line and g-line, respectively, by means of the prism element 133. Denoted at 138 is another prism element for transforming the color dispersed slit lights 135, 135 and 137 of arcuate shape into a substantially integral slit light 139 of arcuate shape. Denoted at 139 is a slit-like illumination region (slit light beam) of arcuate shape.

Here, the prism element 138 has substantially the same shape as the prism element 133. It functions so that, when light rays from the slit lights 135, 136 and 137 of arcuate shape having been dispersed by the prism element 133 are incident thereon without passage through any condenser lens, the lights are deflected in an opposite direction as by the prism 133 and color dispersion inversive to that by the prism 133 is applied to them, such that the arches can be combined with each other at the same position.

When the slit light beam of oblong shape comprises light having three wavelengths of g-line, h-line and i-line, the light to be emitted from the prism element 133 is dispersed into lights such as at 135, 136 and 137. Under the state being so dispersed, the light enters the prism element 138, whereby slit light 139 of arcuate shape, free from color dispersion, can be provided.

FIGS. 9A to 9D are schematic views for explaining an arcuate illumination optical system according to a fifth embodiment of the present invention.

Figure 9A:
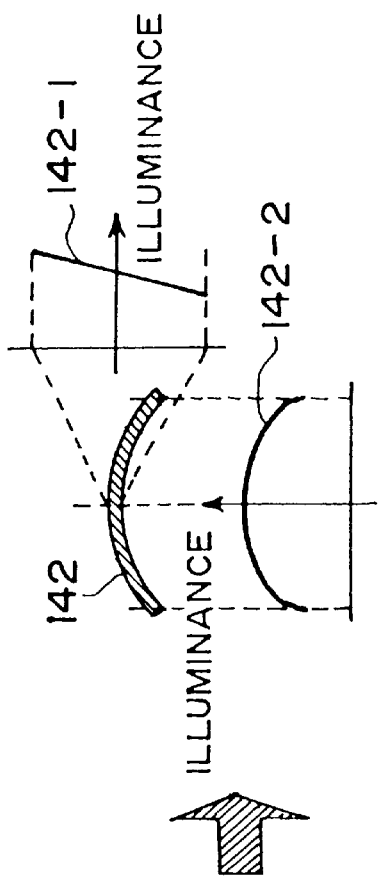
FIGS. 9A to 9D are schematic views for explaining the relationship between an illuminance distribution upon an oblong slit and an illuminance distribution upon an arcuate illumination region provided thereby, in a portion of an arcuate illumination optical system according to a fifth embodiment of the present invention.
Figure 9B:
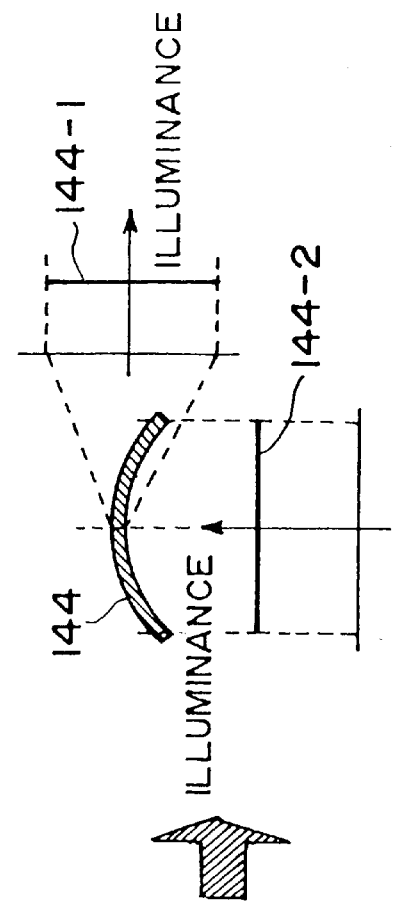

If there is a luminance distribution upon a slit 141 of oblong shape, which is made uniform in its widthwise direction at 141-1 and in its lengthwise direction at 141-2, as shown in FIG. 9A, due to the difference in angular magnification caused by the prism element used for arch transformation, there is produced an illuminance distribution upon an arch 142, which is not uniform in the radius direction at 142-1 and in the deviation angle direction at 142-2, as shown in FIG. 9B.

Figure 9C:
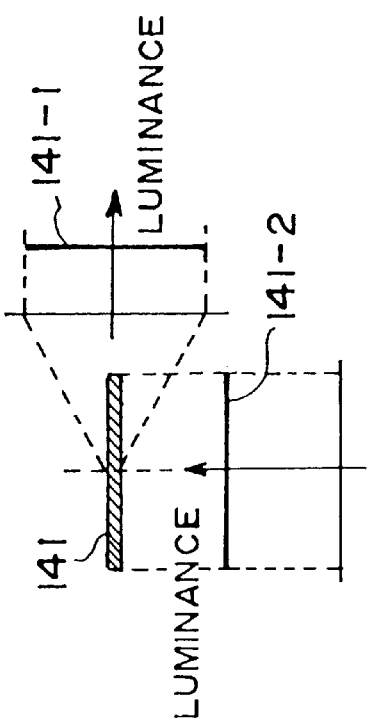
Figure 9D:
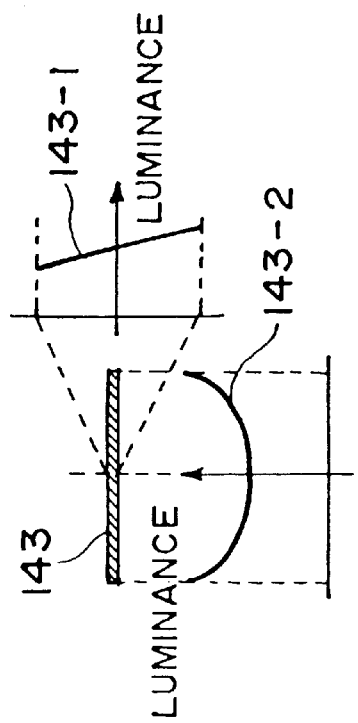

On the other hand, since the difference in angular magnification can be determined by calculation, the arcuate illumination optical system of this embodiment is provided with optical means which serves to apply a luminance distribution upon a slit 143 of oblong shape, beforehand, with a distribution at 143-1 in the widthwise direction and at 143-2 in the lengthwise direction as shown in FIG. 9C, so as to cancel the effect of angular magnification difference.

With this arrangement, a substantially uniform illuminance distribution with a distribution at 144-1 in the radius direction and at 144-2 in the deviation angle direction, as illustrated, is produced. Here, while the luminance distribution shown in FIG. 9C has distributions both in the lengthwise direction and the widthwise direction of the oblong shape, if the length in the lengthwise direction is short, only the luminance distribution in the widthwise direction may be sufficient to meet it.

The luminance distribution adjustment described above can be applied to any other embodiments described above in this specification.

Figure 10:
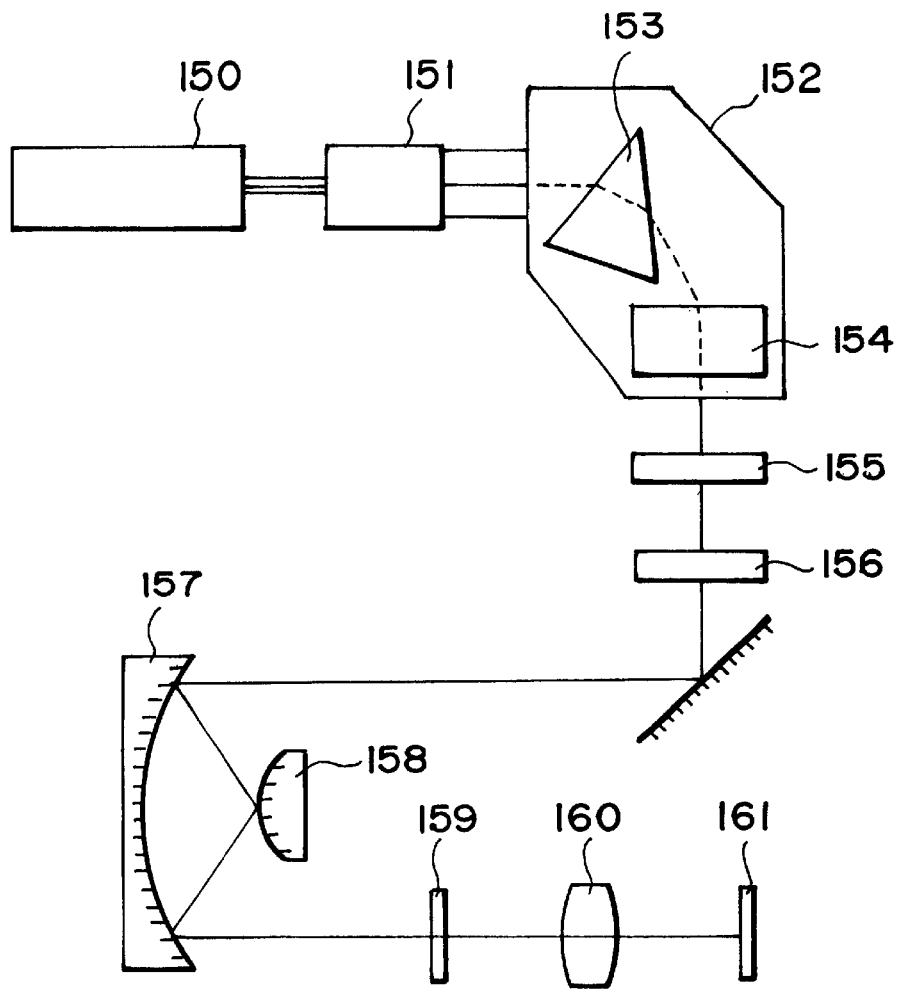
FIG. 10 is a schematic view of a main portion of an exposure apparatus being provided with luminance distribution adjusting means.

FIG. 10 is a schematic view of an exposure apparatus into which an arcuate illumination optical system with luminance distribution adjusting means, such as described above, is incorporated. Denoted in the drawing at 150 is an excimer laser light source, and denoted at 151 is a beam shape changing optical system. The beam shape changing optical system 151 may comprise a cylindrical lens, a toric lens, an anamorphic lens or an optical pipe of slit-like shape, for example, and it serves to transform the shape of output light from the laser light source 150 into slit-like light of oblong sectional shape, efficiently. Also, there is luminance distribution adjusting means which may comprise a light quantity filter, for example, and thus the luminance distribution within the light beam is set so that the illuminance distribution on the arch is made uniform.

The light outputted from the beam shape changing optical system 151 corresponds to the luminance distribution of the slit light of oblong shape shown in the FIG. 9C. Denoted at 152 is an arch transforming optical system. It includes a portion 153 where a prism element is provided, as shown in FIG. 1. Denoted at 154 is an arch combining optical system such as that shown in FIG. 6. It functions to transform the light from the light source 150 into slit light of an arcuate shape. Here, the arch transforming optical system 152 may comprise a structure such as the arch transforming optical system of the embodiment of FIG. 7 or 8, having correcting means for correcting dispersion of a prism.

Denoted at 155 is a correcting element for for correcting an arcuate illumination region as defined by the arch transforming optical system 152 in accordance with the need for practical illumination of a mask or a reticle. Specifically, it comprises a correction optical system which functions so that the arch transforming optical system 152 is kept telecentric. Denoted at 156 is an arcuate slit having an arcuate opening, for extracting a predetermined size from the portion being illuminated in arcuate shape. The width of the arcuate slit 156 in a radial direction is variable, such that the uniformness of illuminance during the scan can be adjusted.

An optical system denoted at 157 and 158 is a relay optical system for imaging the arcuate slit 156. By means of this relay optical system at 157 and 158, the arcuate slit 156 is imaged upon a mark or a reticle (object) 159 having a pattern, formed thereon, to be transferred to a predetermined plane. Thus, the object 159 is illuminated with the light from the arcuate slit 156.

The pattern on the object 159 thus illuminated is imaged upon a substrate or a wafer 161 (which is a workpiece to be exposed) by means of the projection optical system 160. When a laser is used as a light source, there is no necessity of correction of color dispersion of the prism element, since the laser light may be considered to be monochromatic light.

If, on the other hand, a short arc lamp such as an ultra-high pressure Hg lamp or a xenon Hg lamp is used, color dispersion of the prism element should be corrected. On that occasion, the embodiment of FIG. 7 or 8 may be applied to the arch transforming optical system 152 of FIG. 10.

In the embodiments of the present invention as described above, light from a light source is first shaped into an oblong shape which can be relatively easily defined by transformation, and thereafter, a prism element is used to transform the shape into an arcuate shape. With this arrangement, various problems involved in incorporating a prism element into an illumination optical system can be solved. With the procedure described above, the light from the light source can be transformed into slit light of arcuate shape, with a good light utilization efficiency and at a high precision so that the system can be used in an exposure apparatus.

In accordance with an embodiment of the present invention, relative alignment between a reticle and a wafer is performed by use of an exposure apparatus (scanning projection exposure apparatus) such as shown in FIGS. 2, 4 or 10, and thereafter, a pattern formed on the reticle surface is transferred to the wafer surface by projection exposure. Subsequently, the wafer is processed by a development treatment, whereby devices are produced.

With the arrangement of components as described above, these embodiments of the present invention have accomplished an arcuate illumination optical system by which slit light of arcuate shape can be produced easily and with a good light utilization efficiency.

As described, these embodiments accomplish an arcuate illumination optical system and an exposure apparatus of a proximity type, step-and-repeat type or step-and-scan type, having such an illumination optical system, by which illumination in arcuate shape can be performed with use of an ordinary discharge tube such as an ultra-high pressure Hg lamp, for example, or a laser light source (and without use of a special light source), with a good light utilization efficiency, while, on the other hand, a predetermined illumination condition can be satisfied.

An arcuate illumination system of good light utilization efficiency can be provided, in relation to a laser light source or a short arc type light source. Also, when it is incorporated into a projection exposure apparatus, an imaging operation of good efficiency and good stability is assured.

Next, an embodiment of a semiconductor device manufacturing method which uses an exposure apparatus according to any one of the preceding embodiments, will be explained.

Figure 12:
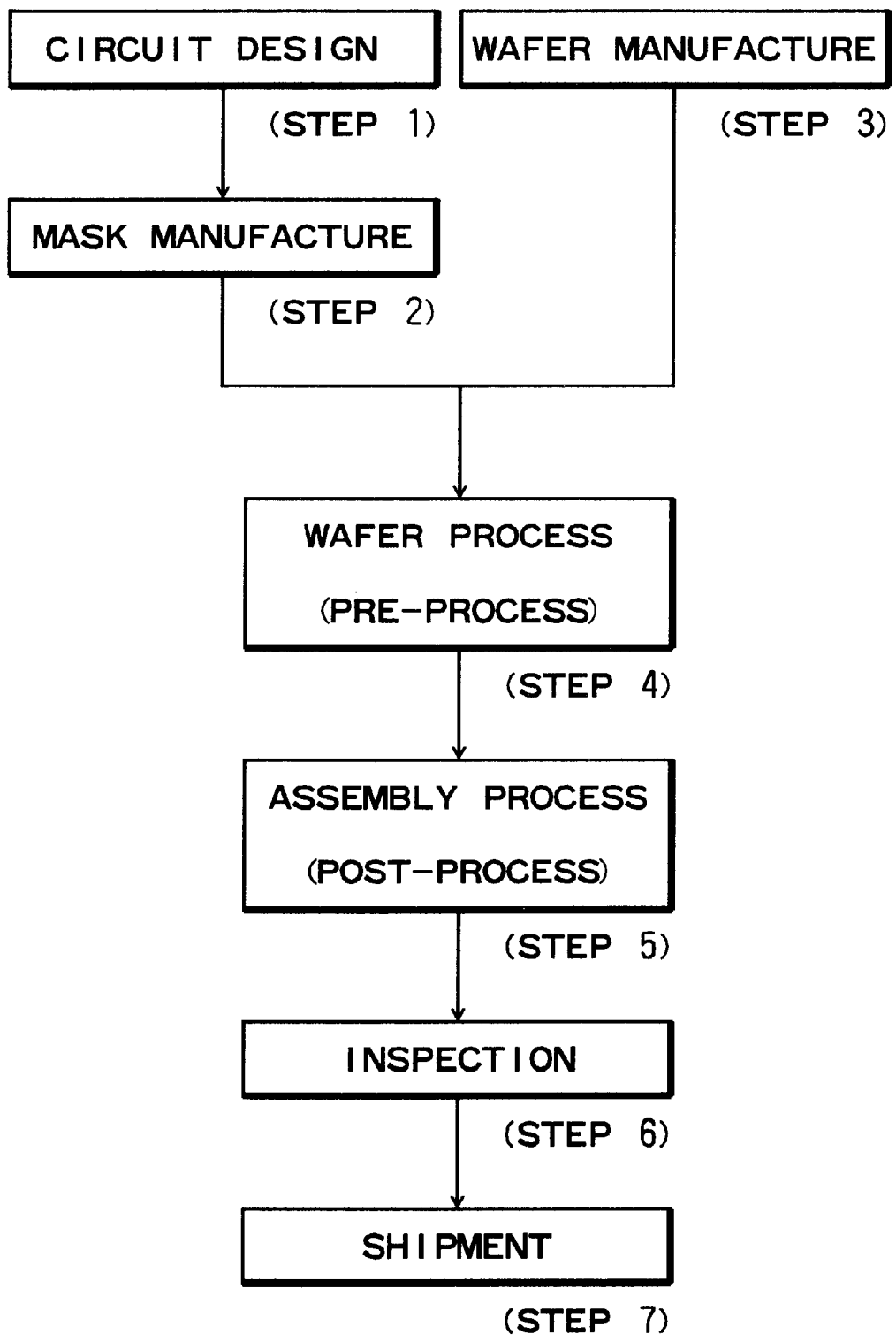
FIG. 12 is a flow chart of semiconductor device manufacturing processes.

FIG. 12 is a flow chart of a procedure for the manufacture of microdevices such as semiconductor chips (e.g., ICs or LSIs), liquid crystal panels, and CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 13:
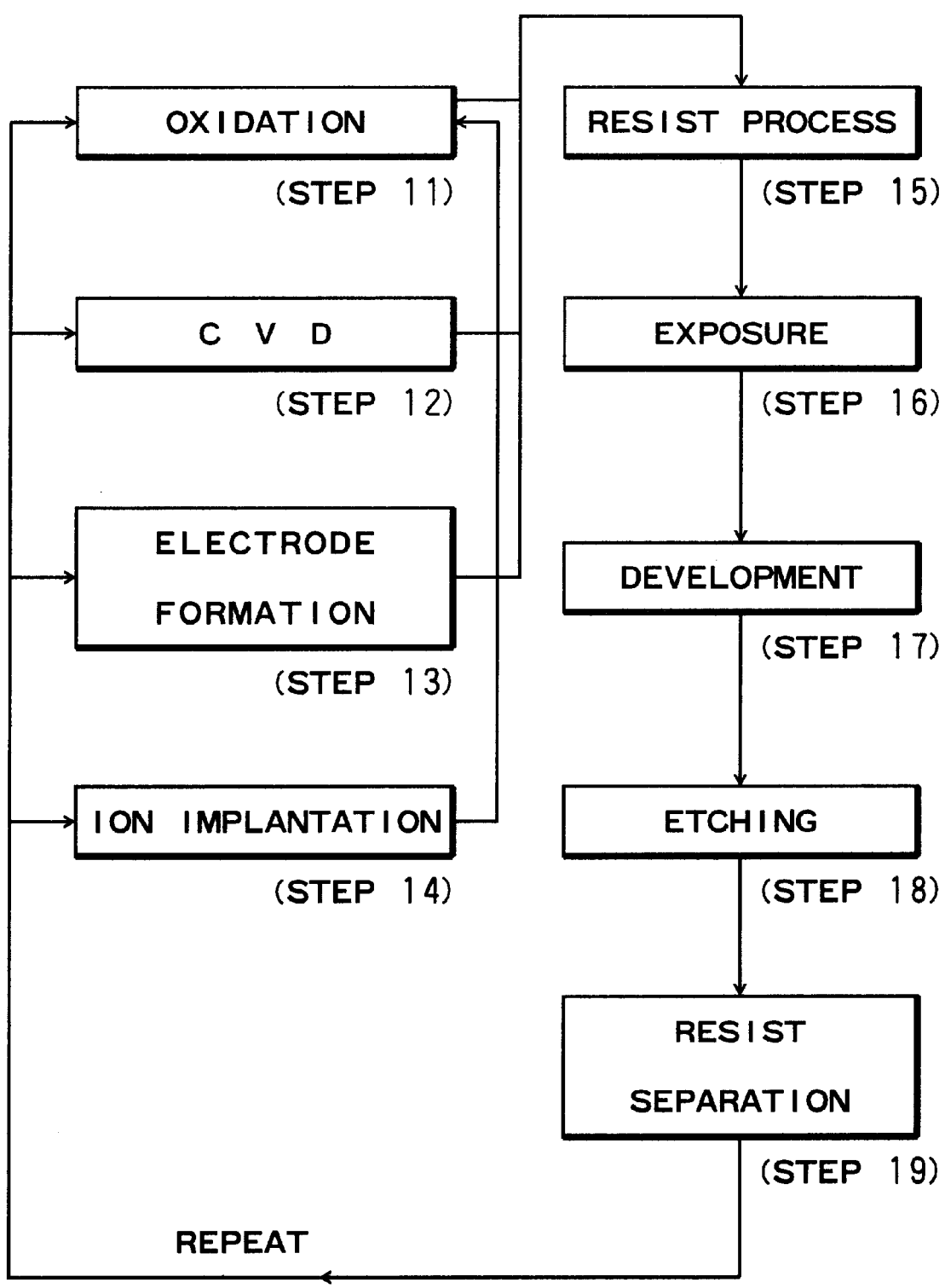
FIG. 13 is a flow chart for explaining details of a wafer process, involved in the procedure of FIG. 12.

FIG. 13 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An illumination optical system for use in an exposure apparatus for projecting a pattern of a mask onto a substrate, wherein the mask is to be illuminated with light of an arcuate shape, said illumination optical system comprising:

a first optical system for providing light having a predetermined shape; and a second optical system for transforming the light of predetermined shape into light of arcuate shape, said second optical system including a first condenser for condensing the light of predetermined shape, a prism element for refracting the light from said first condenser, and a second condenser for condensing the light from said prism element.

2. An illumination optical system for use in an exposure apparatus for projecting a pattern of a mask onto a substrate, wherein the mask is to be illuminated with light of an arcuate shape, said illumination optical system comprising:

a first transforming optical system for transforming light, supplied from a light source, into light of an oblong shape; and a second transforming optical system for transforming the light of oblong shape into light of arcuate shape, said second transforming optical system including a first condenser for condensing the light of oblong shape, a prism element for refracting the light from said first condenser, and a second condenser for condensing the light from said prism element.

3. An illumination optical system according to claim 2, further comprising dividing means for dividing the slit-like light of arcuate shape into plural slit-like lights of arcuate shape, and combining means for combining the plural slit-like lights of arcuate shape along a circumferential direction to provide second slit-like light of arcuate shape being longer, in the circumferential direction, than the slit-like light of arcuate shape provided by said first transforming optical system.

4. An illumination optical system according to claim 2, wherein said second transforming system includes correcting means for correcting dispersion of said prism element.

5. An illumination optical system according to claim 4, wherein said correcting means comprises a diffractive element.

6. An illumination optical system according to claim 4, wherein said correcting means comprises a prism element of the same shape as that of said prism element for refracting the light from said first condenser.

7. An illumination optical system according to claim 2, further comprising luminance distribution adjusting means for adjusting a luminance distribution of the slit-like light of oblong shape so that an illuminance distribution of the slit-like light of arcuate shape becomes substantially uniform.

8. An illumination optical system according to claim 2, wherein said second transforming optical system comprises a first lens for converging the oblong-shaped light and for directing the oblong-shaped light to the prism element, and a second lens for converging the oblong-shaped light to be divergently emitted from the prism element.

9. An exposure apparatus, comprising:

an illumination optical system as recited in any one of claims 1–8, for illuminating a mask having a pattern formed thereon; and a projection optical system for projecting the pattern of the mask onto a wafer.

10. An apparatus according to claim 9, further comprising scanning means for scanning the mask and the wafer during an exposure process, in a widthwise direction of the slit-like light of arcuate shape.

11. A device manufacturing method, comprising the steps of:

exposing a wafer to a device pattern by using an exposure apparatus as recited in claim 9; and developing a resist of the exposed wafer.

12. A device manufacturing method, comprising the steps of:

exposing a wafer to a device pattern by using an exposure apparatus as recited in claim 10; and developing a resist of the exposed wafer.

* * * * *

UNITED STATES PATENT AND TRADEMARK OFFICE
CERTIFICATE OF CORRECTION

PATENT NO. : 6,441,886 B2
DATED : August 27, 2002
INVENTOR(S) : Akiyoshi Suzuki et al.

It is certified that error appears in the above-identified patent and that said Letters Patent is hereby corrected as shown below:

Column 1,
Line 42, "slit like" should read -- slit-like --.
Line 65, "shape" should read -- shaped --.

Column 4,
Line 65, "image" should read -- imaged --.

Column 7,
Line 64, "coti1" should read -- $coti_1$ --.

Column 8,
Line 5, "corresponds to that" should read -- corresponds to --.
Line 6, "is" should read -- being --.
Line 7, "oblong-shape" should read -- oblong-shaped --.

Column 9,
Line 9, "slight" should read -- slit --.
Line 53, "Denoted" should read -- Denoted at --.
Line 59, "slit like" should read -- slit-like --.

Column 10,
Line 32, the second occurrence of "135" should read -- 136 --.

Column 11,
Line 44, the second occurrence of "for" should be deleted.

UNITED STATES PATENT AND TRADEMARK OFFICE
CERTIFICATE OF CORRECTION

PATENT NO. : 6,441,886 B2
DATED : August 27, 2002
INVENTOR(S) : Akiyoshi Suzuki et al.

It is certified that error appears in the above-identified patent and that said Letters Patent is hereby corrected as shown below:

Column 13,
Line 17, "subjected circuit" should read -- subjected to the etching process. By repeating these processes, circuit --.

Signed and Sealed this

Eleventh Day of February, 2003

JAMES E. ROGAN
*Director of the United States Patent and Trademark Office*